United States Patent
Chen et al.

(10) Patent No.: US 7,193,853 B2
(45) Date of Patent: Mar. 20, 2007

(54) HEAT SINK PROTECTING RETENTION MODULE

(75) Inventors: Yu-Lin Chen, Panchiao (TW); Chuan-Chieh Tseng, Yungho (TW); Po-Li Hsieh, Douliou (TW); Tzu-Kai Chen, Taoyuan (TW)

(73) Assignee: Quanta Computer Inc., Tao Yuan Shien (TW)

( * ) Notice: Subject to any disclaimer, the term of this patent is extended or adjusted under 35 U.S.C. 154(b) by 176 days.

(21) Appl. No.: 11/049,653

(22) Filed: Feb. 4, 2005

(65) Prior Publication Data

US 2006/0176669 A1    Aug. 10, 2006

(51) Int. Cl.
*H05K 7/20* (2006.01)

(52) U.S. Cl. ............. 361/719; 361/704; 165/80.3; 174/16.3; 257/718

(58) Field of Classification Search ............. None
See application file for complete search history.

(56) References Cited

U.S. PATENT DOCUMENTS

| | | | |
|---|---|---|---|
| 6,191,478 B1 * | 2/2001 | Chen | 257/718 |
| 6,707,674 B1 * | 3/2004 | Bryant et al. | 361/704 |
| 6,781,837 B2 * | 8/2004 | Kannmacher et al. | 361/704 |
| 6,859,367 B2 * | 2/2005 | Davison | 361/704 |
| 6,867,975 B2 * | 3/2005 | Kashiwagi | 361/704 |
| 6,952,348 B2 * | 10/2005 | Wu | 361/719 |
| 7,009,844 B2 * | 3/2006 | Farrow et al. | 361/704 |

* cited by examiner

*Primary Examiner*—Boris Chervinsky
(74) *Attorney, Agent, or Firm*—Rabin & Berdo, PC

(57) ABSTRACT

A heat sink protecting retention module is described. The heat sink protecting retention module has a main frame, protective feet, hooks, and a positioning mechanism. The protective feet are disposed under the main frame to keep screws therein before the heat sink protecting retention module is installed on the motherboard so as to avoid scratching the motherboard or damaging electric components thereon. The hooks are disposed on the main frame for clamping the heat sink and the positioning mechanism are disposed around and under the main frame for aligning the heat sink protecting retention module to a central processing unit socket.

22 Claims, 2 Drawing Sheets

HEAT SINK PROTECTING RETENTION MODULE

FIELD OF THE INVENTION

The present invention relates to a heat sink protecting retention module, and more particularly, to a central processing unit heat sink protecting retention module.

BACKGROUND OF THE INVENTION

Information technology and the computer industry are highly developed now. People rely heavily on computer systems. Therefore, computer servers with high calculation capacity and high stability are important for computer systems. Due to increasingly reduced office space, area occupied by computer servers must also be reduced. Computer servers maintain a high degree of stability to serve users, and the space occupied by one computer server is usually greater than or equal to that of a desktop computer. The management of computer servers is difficult and space utilization is tightened. Some normal companies have 2 or 3 computer servers, while some others may have more than a thousand computer servers. Computer server management and space utilization become more critical in companies with more computer servers.

A 1U computer server assembled on a standard 1U server rack is the mainstream computer server arrangement. Each standard layer of the rack is about 1.75 inches (about 4.5 centimeters), so that the 1U server and the rack effectively conserve occupational space of the computer servers. Moreover, the 1U servers and racks are more efficiently controlled because the 1U servers and racks can be centrally managed and easily stacked. Normally, hardware used in the 1U server is provided with a smaller size and lower height to fit the thickness limitation of 1.75 inches.

A server system is convenient to use because the server system provides a large storing space and a stable processing environment. To maintain the stable processing environment, the heat sink for cooling the central processing unit (CPU) is very important. Due to the dimension limitation of the components configured in the 1U sever rack, typically stable fixing components for fixing the heat sink of the CPU on a motherboard are screws. However, the screws and the heat sink are normally made of metal and may touch the motherboard to scratch the motherboard or damage electric circuits thereon while installing the heat sink on the motherboard.

SUMMARY OF THE INVENTION

It is an object of the present invention to provide a heat sink protecting retention module with protective feet to avoid scratching a motherboard or damaging electric components thereon.

It is another object of the present invention to provide a heat sink protecting retention module convenient to installation of the heat sink for uniformly touching and cooling a central processing unit on a motherboard.

To accomplish the above objectives, the present invention provides a heat sink protecting retention module to avoid scratching a motherboard or damaging electric components thereon and to install easily the heat sink on the motherboard at a predetermined position and altitude. The heat sink protecting retention module has a main frame, a plurality of protective feet, a plurality of hooks, and a positioning mechanism.

The protective feet are disposed under the main frame to keep fixing devices, e.g. screws, in the protective feet before the heat sink protecting retention module is installed on the motherboard. Therefore, the heat sink protecting retention module can avoid scratching the motherboard or damaging electric components on the motherboard while the heat sink protecting retention module and a heat sink are installed on the motherboard. The hooks are disposed on the main frame to clamp the heat sink and the positioning mechanism are disposed around and under the main frame for aligning the heat sink protecting retention module to a central processing unit socket on the motherboard.

The positioning mechanism, preferably two positioning walls and two positioning studs, couples to four edges of the central processing unit socket for aligning the heat sink to a central processing unit fixed on the central processing unit socket. The main frame further includes an opening to that allows the heat sink to be in direct contact with the central processing unit, whereby the heat sink directly cools the central processing unit.

The heat sink protecting retention module is preferably made of plastic material and more preferably made of plastic material in one-shot molding. The main frame further has a plurality of recessions for controlling strokes of the fixing devices.

In another aspect of the present invention, the present invention provides a heat sink module. The heat sink module includes a heat sink, a plurality of fixing devices a plurality of elastic devices, a plurality of stop devices, and a heat sink protecting retention module. The elastic device is configured on the fixing devices and the stop device is fixed on the fixing device to keep the fixing device and the elastic device on the heat sink.

The heat sink protecting retention module clamps the heat sink for installing the heat sink on a motherboard to cool a central processing unit thereon. Before the heat sink module is installed on the motherboard, the fixing devices are drawn back in the heat sink protecting retention module to avoid scratching the motherboard and damaging electric components thereon. The stop device stops on a concave surface of the recession of the heat sink protecting retention module to maintain a predetermined pressure on the heat sink caused by the elastic device be compressed.

Hence, the heat sink protecting retention module can avoid scratching the motherboard or damaging electric components on the motherboard while the heat sink is installed on the motherboard. In addition, the heat sink protecting retention module allows convenient installation of the heat sink on the motherboard at a desired position and altitude so that the heat sink can uniformly touch and cool the central processing unit on the motherboard. Furthermore, the heat sink protecting retention module is preferably applied to a 1U server system because the heat sink protecting retention module is compatible with a conventional heat sink and a convention motherboard without increasing heights thereof.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein.

DETAILED DESCRIPTION OF THE PREFERRED EMBODIMENT

The following description is of the best presently contemplated mode of carrying out the present invention. This description is not to be taken in a limiting sense but is made merely for the purpose of describing the general principles of the invention. The scope of the invention should be determined by referencing the appended claims.

Figure 1:
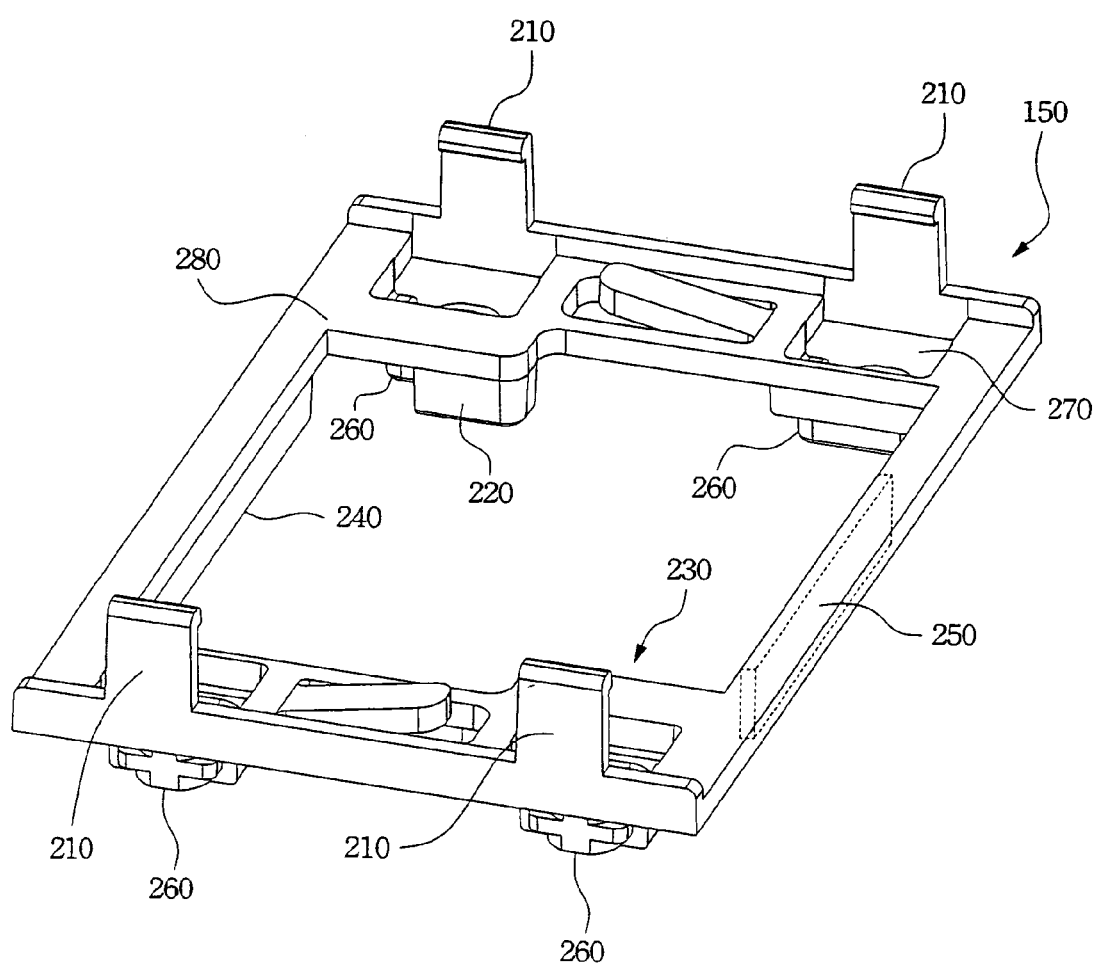
FIG. 1 is a detailed perspective view of a preferred embodiment of a heat sink protecting retention module according to the present invention.

FIG. 1 is a detailed perspective view of a preferred embodiment of a heat sink protecting retention module according to the present invention. The heat sink protecting retention module 150 includes a main frame 280 with an opening for disposing a central processing unit therein, hooks 210 disposed on the main frame 280, protective feet 260 disposed under the main frame 280, a first positioning wall 240, a second positioning wall 250, a first positioning stud 220, and a second positioning stud 230. The hooks 210 are preferably disposed at four corners of the main frame 280 to clamp a heat sink on the main frame 280. The heat sink protecting retention module 150 is preferably made of plastic material with one-shot molding.

The first positioning wall 240, the second positioning wall 250, the first positioning stud 220, and the second positioning stud 230 are disposed under the main frame 280 and are preferably disposed at four sides of the main frame 280. The first positioning wall 240, the second positioning wall 250, the first positioning stud 220, and the second positioning stud 230 construct a positioning mechanism to couple to four sides of a CPU socket and align to the CPU socket. The protective feet 260 of the heat sink protecting retention module 150 keep screws therein before fixing on a motherboard and therefore scratching motherboard and damaging electric components can be effectively avoided. The heat sink protecting retention module 150 further includes recessions 270 above the protective feet 260.

Figure 2:
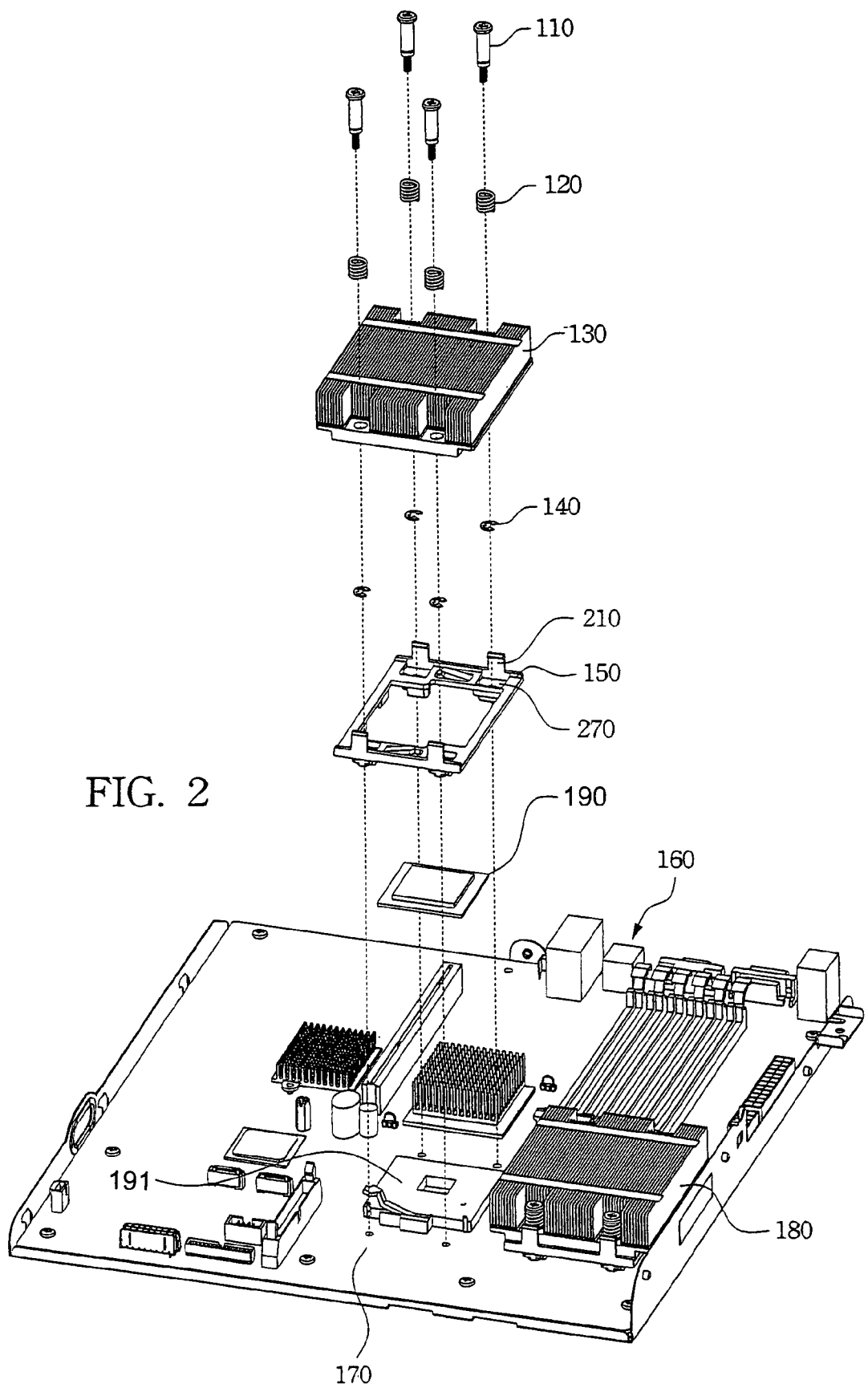
FIG. 2 is an exploded view of the heat sink protecting retention module according to the present invention installed on a motherboard with two CPU.

Referring to FIG. 2, in conjunction with the detailed perspective view of FIG. 1, FIG. 2 illustrates an exploded view of the heat sink protecting retention module according to the present invention installed on a motherboard with two CPUs. While installing a heat sink 130 on a motherboard 160 with a heat sink protecting retention module 150, fixing devices 110 with elastic devices 120, e.g. springs, first pass through the heat sink 130 and then couple with stop device 140. Subsequently, the hooks 210 of the heat sink protecting retention module 150 clamp on the heat sink 130. The stop devices 140 are therefore disposed in the recession 270 of the heat sink protecting retention module 150. The stop devices 140 not only prevent the fixing devices 110 from falling out of the heat sink 130 but also maintain a predetermined pressure on the heat sink 130 to keep the heat sink 130 in uniform contact with a CPU 190. The stop device 140 further provides a stop function for the fixing device 110 when the stop device 140 touches a concave surface in the recession 270. Therefore, a stroke of the fixing device 110 can be effectively controlled by a depth of the recession 270.

Subsequently, the heat sink 130 with the heat sink protecting retention module 150 is disposed on the motherboard 160 to couple to the CPU 190 and align with a CPU socket 191. Because the heat sink protecting retention module 150 has the positioning mechanism to couple to four sides of the CPU socket 191, the heat sink 130 and the heat sink protecting retention module 150 may automatically align with the CPU socket 191, that is, automatically align with the CPU 190. Furthermore, the protective feet 260 keep the fixing devices 110 therein and therefore the fixing devices 110, e.g. screws, can avoid contact with the motherboard 160 and the electric components thereon. After the heat sink protecting retention module 150 is disposed on the motherboard 160 and aligned with the CPU socket 191, a user can easily fix the fixing devices 110 on the motherboard 160. The fixing device 110 is then stopped when the stop device 140 touches the concave surface of the recession 270. In the meantime, the elastic devices 120 are compressed by the fixing device 110 to press the heat sink 130 with predetermined pressure so that the heat sink 130 can uniformly and easily come in contact with the CPU 190. Referring to heat sink 180, the heat sink 180 is fixed on the motherboard 160 without influencing a height of the heat sink 180.

The heat sink protecting retention module according to the present invention utilizes the protective feet to avoid scratching the motherboard or damaging the electric components thereon. In addition, the heat sink protecting retention module with the positioning mechanism allow easy installation of the heat sink on the motherboard and positioning of the heat sink on the CPU. Furthermore, the heat sink protecting retention module can keep the heat sink at an original position and altitude because the heat sink protecting retention module is compatible with a conventional heat sink and a convention motherboard without increasing the heights thereof. Therefore, the heat sink protecting retention module preferably applies to a 1U server system without influence on the heat sink and the motherboard.

As is understood by a person skilled in the art, the foregoing preferred embodiments of the present invention are illustrative of the present invention rather than limiting of the present invention. It is intended that various modifications and similar arrangements be included within the spirit and scope of the appended claims, the scope of which should be accorded the broadest interpretation so as to encompass all such modifications and similar structures.

What is claimed is:

1. A heat sink protecting retention module, comprising:
  a main frame;
  a plurality of protective feet disposed under the main frame to keep elastic fixing devices therein so as to avoid scratching a motherboard while installing the heat sink protecting retention module and a heat sink on the motherboard;
  a plurality of hooks disposed on the main frame to clamp the heat sink; and
  a positioning mechanism disposed around and under the main frame for aligning the heat sink protecting retention module to a central processing unit socket on the motherboard.

2. The heat sink protecting retention module of claim 1, wherein the positioning mechanism further comprises two positioning walls and two positioning studs.

3. The heat sink protecting retention module of claim 2, wherein the positioning walls and two positioning studs couple to four edges of the central processing unit socket for aligning the heat sink to a central processing unit fixed on the central processing unit socket.

4. The heat sink protecting retention module of claim 1, wherein the main frame further comprises an opening to allow direct contact of the heat sink with a central processing unit fixed on the central processing unit socket, and the heat sink thereby directly cools the central processing unit.

5. The heat sink protecting retention module of claim 1, wherein the heat sink protecting retention module is made of plastic material.

6. The heat sink protecting retention module of claim 5, wherein the heat sink protecting retention module is made by one-shot molding.

7. The heat sink protecting retention module of claim 1, wherein the main frame further comprises a plurality of recessions for controlling strokes of the fixing devices.

8. The heat sink protecting retention module of claim 1, wherein the elastic fixing device includes a stop device and an elastic devices, and the elastic device is compressed by the fixing device to press the heat sink with predetermined pressure when the stop device touches the surface of the motherboard.

9. A plastic heat sink protecting retention module, comprising:
a main frame;
a plurality of protective feet disposed under the main frame to keep elastic fixing devices therein so as to avoid scratching a motherboard while installing the plastic heat sink protecting retention module and a heat sink on the motherboard;
a plurality of hooks disposed on the main frame to clamp the heat sink; and
four positioning members disposed around and under four sides of the main frame for aligning the plastic heat sink protecting retention module to a central processing unit socket on the motherboard.

10. The plastic heat sink protecting retention module of claim 9, wherein the positioning members further comprises two positioning walls and two positioning studs to couple to four edges of the central processing unit socket for aligning the heat sink to a central processing unit fixed on the central processing unit socket.

11. The plastic heat sink protecting retention module of claim 9, wherein the main frame further comprises an opening to allow the heat sink to be in direct contact with a central processing unit fixed on the central processing unit socket, and the heat sink thereby directly cools the central processing unit.

12. The plastic heat sink protecting retention module of claim 9, wherein the plastic heat sink protecting retention module is made by one-shot molding.

13. The plastic heat sink protecting retention module of claim 9, wherein the main frame further comprises a plurality of recessions for controlling strokes of the fixing devices.

14. The heat sink protecting retention module of claim 9, wherein the elastic fixing device includes a stop device and an elastic devices, and the elastic device is compressed by the fixing device to press the heat sink with predetermined pressure when the stop device touches the surface of the motherboard.

15. A heat sink module, comprising:
a heat sink;
a plurality of fixing devices;
a plurality of elastic devices configured on the fixing devices;
a plurality of stop devices fixed on the fixing devices to maintain the fixing devices and the elastic devices on the heat sink; and
a heat sink protecting retention module for installing the heat sink on a motherboard to cool a central processing unit, wherein the heat sink protecting retention module further comprises:
a main frame;
a plurality of protective feet disposed under the main frame to keep the fixing devices therein so as to avoid scratching the motherboard while installing the heat sink protecting retention module and the heat sink on the motherboard;
a plurality of hooks disposed on the main frame to clamp the heat sink; and
a positioning mechanism disposed around and under the main frame for aligning the heat sink protecting retention module to a central processing unit socket on the motherboard.

16. The heat sink module of claim 15, wherein the positioning mechanism further comprises two positioning walls and two positioning studs.

17. The heat sink module of claim 16, wherein the positioning walls and two positioning studs couple to four edges of the central processing unit socket for aligning the heat sink to a central processing unit fixed on the central processing unit socket.

18. The heat sink module of claim 15, wherein the main frame further comprises an opening to allow the heat sink to be in direct contact with the central processing unit fixed on the central processing unit socket, and the heat sink thereby directly cools the central processing unit.

19. The heat sink module of claim 15, wherein the heat sink protecting retention module is made of plastic material.

20. The heat sink module of claim 19, wherein the heat sink protecting retention module is made by one-shot molding.

21. The heat sink module of claim 15, wherein the main frame further comprises a plurality of recessions for controlling strokes of the fixing devices.

22. The heat sink module of claim 21, wherein the stop device stops on a concave surface of the recession to maintain a predetermined pressure on the heat sink caused by the elastic device be compressed.

* * * * *